United States Patent
Hsu

(10) Patent No.: US 11,349,257 B2
(45) Date of Patent: May 31, 2022

(54) ELECTRICAL CONNECTOR ASSEMBLY MOUNTED UPON PCB

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Shuo-Hsiu Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/004,776

(22) Filed: Aug. 27, 2020

(65) Prior Publication Data

US 2021/0066851 A1    Mar. 4, 2021

(30) Foreign Application Priority Data

Aug. 27, 2019    (CN) .......................... 201910794967.4

(51) Int. Cl.
*H01R 13/631* (2006.01)
*H01R 13/627* (2006.01)
*H01R 12/71* (2011.01)

(52) U.S. Cl.
CPC ......... *H01R 13/631* (2013.01); *H01R 12/716* (2013.01); *H01R 13/6273* (2013.01)

(58) Field of Classification Search
CPC . H01R 13/631; H01R 13/6273; H01R 12/716
See application file for complete search history.

(56) References Cited

U.S. PATENT DOCUMENTS

| | | | |
|---|---|---|---|
| 8,257,098 B2* | 9/2012 | Yeh ...................... | H05K 7/1053 439/135 |
| 8,998,623 B2* | 4/2015 | Hsu ........................ | H05K 3/341 439/70 |
| 9,022,791 B2* | 5/2015 | Liao .................... | H01R 12/7005 439/71 |

(Continued)

FOREIGN PATENT DOCUMENTS

CN    201112659 Y    10/2008

*Primary Examiner* — Abdullah A Riyami
*Assistant Examiner* — Nader J Alhawamdeh
(74) *Attorney, Agent, or Firm* — Ming Chieh Chang; Wei Te Chung

(57) ABSTRACT

An electrical connector assembly includes an electrical connector and the pick-up cap assembled upon the housing of the electrical connector. A plurality of contacts are disposed in the housing and covered by the pick-up cap. The pick-up cap includes a pair of first side walls, and the housing includes a pair of first side faces corresponding to the pair of corresponding first side walls. Each first side face forms a pair of locking recesses. Each first side wall includes an operation section and a pair of latches. The operation section includes a cavity in the first side wall and a raised section above the cavity. Each latch includes a spring arm, and a hook located at the end of the spring arm and engaged within the corresponding locking recess. The latch is located within the boundary of the housing without extending beyond the corresponding side face.

16 Claims, 5 Drawing Sheets

(56) References Cited

U.S. PATENT DOCUMENTS

| | | | |
|---|---|---|---|
| 9,131,613 B2* | 9/2015 | Hsu | H05K 7/1061 |
| 9,426,917 B2* | 8/2016 | Hsu | H05K 7/1061 |
| 2014/0080328 A1* | 3/2014 | Liao | H05K 7/1053 |
| | | | 439/68 |
| 2014/0235098 A1* | 8/2014 | Hsu | H05K 7/1061 |
| | | | 439/577 |
| 2015/0229063 A1* | 8/2015 | Hsu | H05K 7/1061 |
| | | | 439/136 |
| 2017/0244185 A1* | 8/2017 | Hsu | H01R 12/7017 |
| 2021/0066851 A1* | 3/2021 | Hsu | H01R 12/716 |
| 2021/0202331 A1* | 7/2021 | Cheng | H01L 23/053 |

* cited by examiner

US 11,349,257 B2

ELECTRICAL CONNECTOR ASSEMBLY MOUNTED UPON PCB

BACKGROUND OF THE DISCLOSURE

1. Field of the Disclosure

The present disclosure relates to an electrical connector with a pick-up cap thereon for mounting to a printed circuit board (PCB), and particularly to the electrical connector with the pick-up cap which is configured and dimensioned not to extend beyond the electrical connector horizontally so as to maximize the available space on the PCB.

2. Description of Related Arts

China Utility Patent No. CN201112659 discloses an electrical connector mounted upon the PCB for mating with a Central Processing Unit (CPU). A pick-up cap is initially assembled upon the connector for mounting the connector to the PCB via a pick-and-place operation. Theoretically speaking, the connector defines its own KOZ (Keep Our Zone) on the PCB so as to leave the remaining space on the PCB for availability. Anyhow, because the pick-up cap essentially extends horizontally beyond the boundary of the housing of the electrical connector in a top view for grasping the circumferential wall of the housing of the electrical connector, such excessive portions beyond the boundary of the housing of the electrical connector may prevent availability of the space/region neighboring the housing of the electrical connector on the PCB, disregarding how large/small such a space/region is.

An improved connector with the pick-up cap which will not jeopardize the availability of the neighboring region around the boundary of the housing of the electrical connector, is desired.

SUMMARY OF THE DISCLOSURE

An object of the invention is to provide an electrical connector assembly including an electrical connector and the pick-up cap assembled upon the housing of the electrical connector. A plurality of contacts are disposed in the housing and covered by the pick-up cap in the vertical direction. The pick-up cap includes a pair of first side walls, and the housing includes a pair of first side faces corresponding to the pair of corresponding first side walls. Each first side face forms a pair of locking recesses. Each first side wall includes an operation section and a pair of latches. The operation section includes a cavity in the first side wall and a raised section above the cavity. Each latch includes a spring arm, and a hook located at the end of the spring arm and engaged within the corresponding locking recess. The latch is located within the boundary of the housing without extending beyond the corresponding side face.

The housing includes a pair of first side partitions corresponding to the pair of first side walls. Each first side partition includes a pair of first top faces and the aforementioned pair of first side faces. Each latch is positioned upon the corresponding top face while the raised section of the operation section is offset from the corresponding latch in both the lateral direction and the vertical direction so as to facilitate unlocking the hook from the corresponding locking recess.

Other objects, advantages and novel features of the disclosure will become more apparent from the following detailed description when taken in conjunction with the accompanying drawings.

DETAILED DESCRIPTION OF THE PREFERRED EMBODIMENT

Reference will now be made in detail to the embodiments of the present disclosure.

Figure 1:
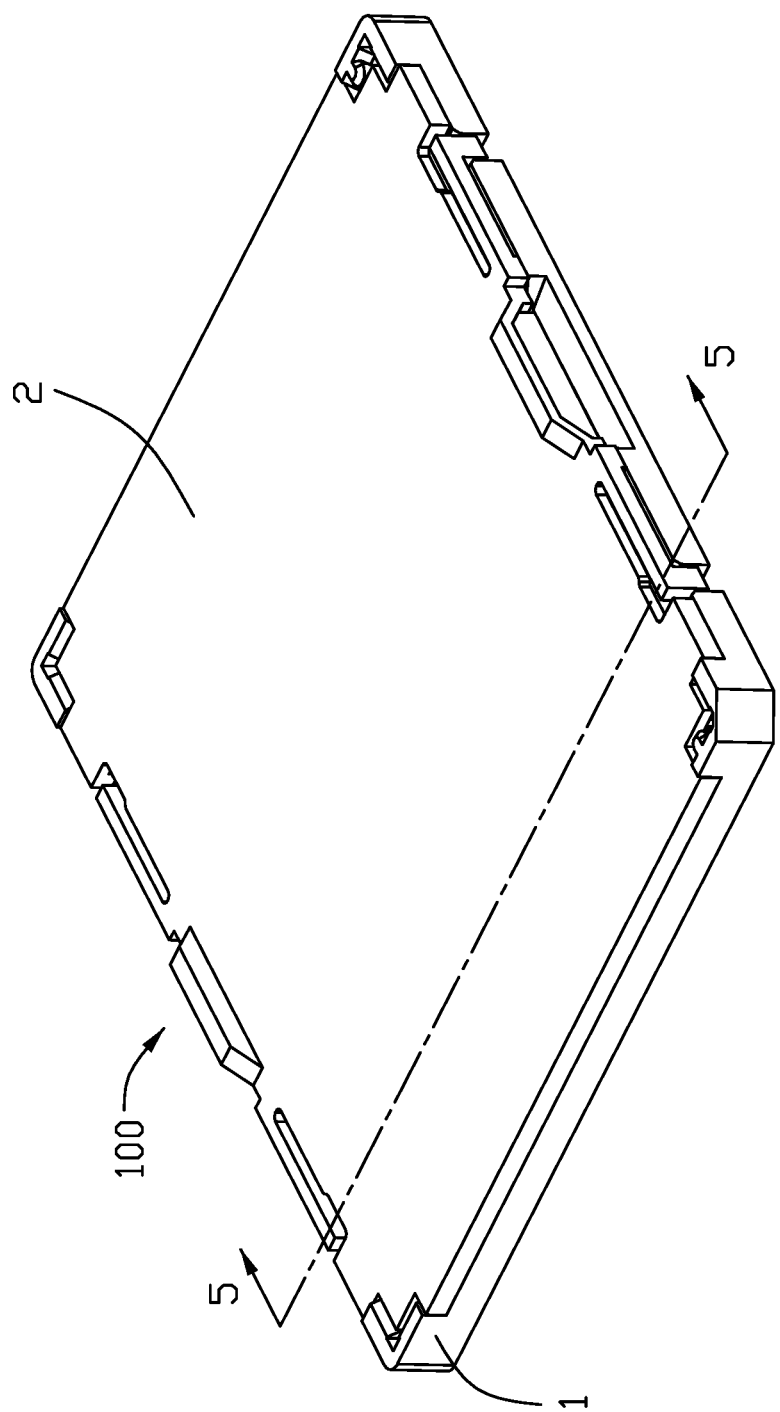
FIG. 1 is a perspective view of an electrical connector assembly including an electrical connector with a pick-up cap assembled thereon according to an embodiment of the invention.
Figure 2:
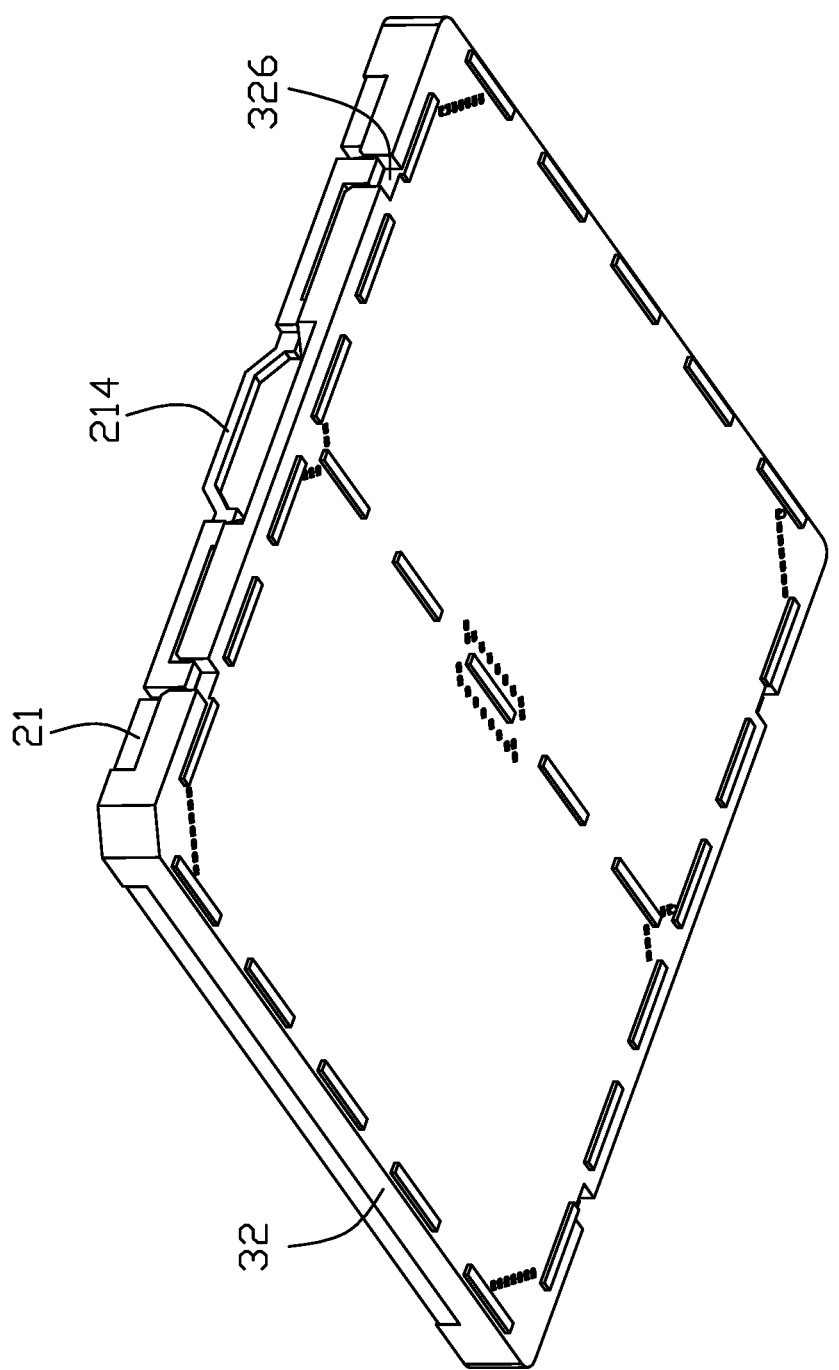
FIG. 2 is another perspective view of the electrical connector assembly of FIG. 1.
Figure 3:
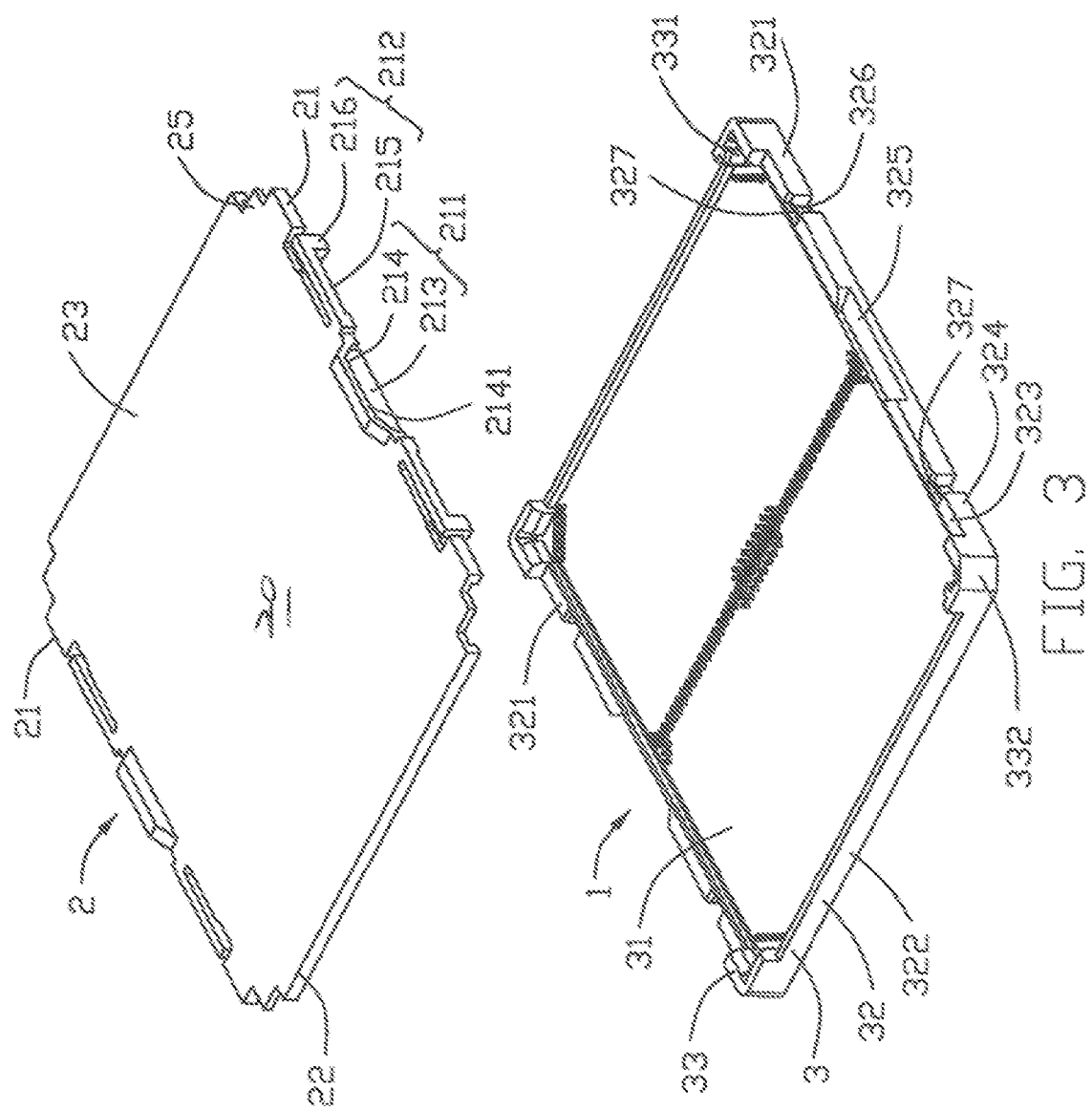
FIG. 3 is a perspective view of the electrical connector assembly of FIG. 1 wherein the pick-up is removed from the connector.
Figure 4:
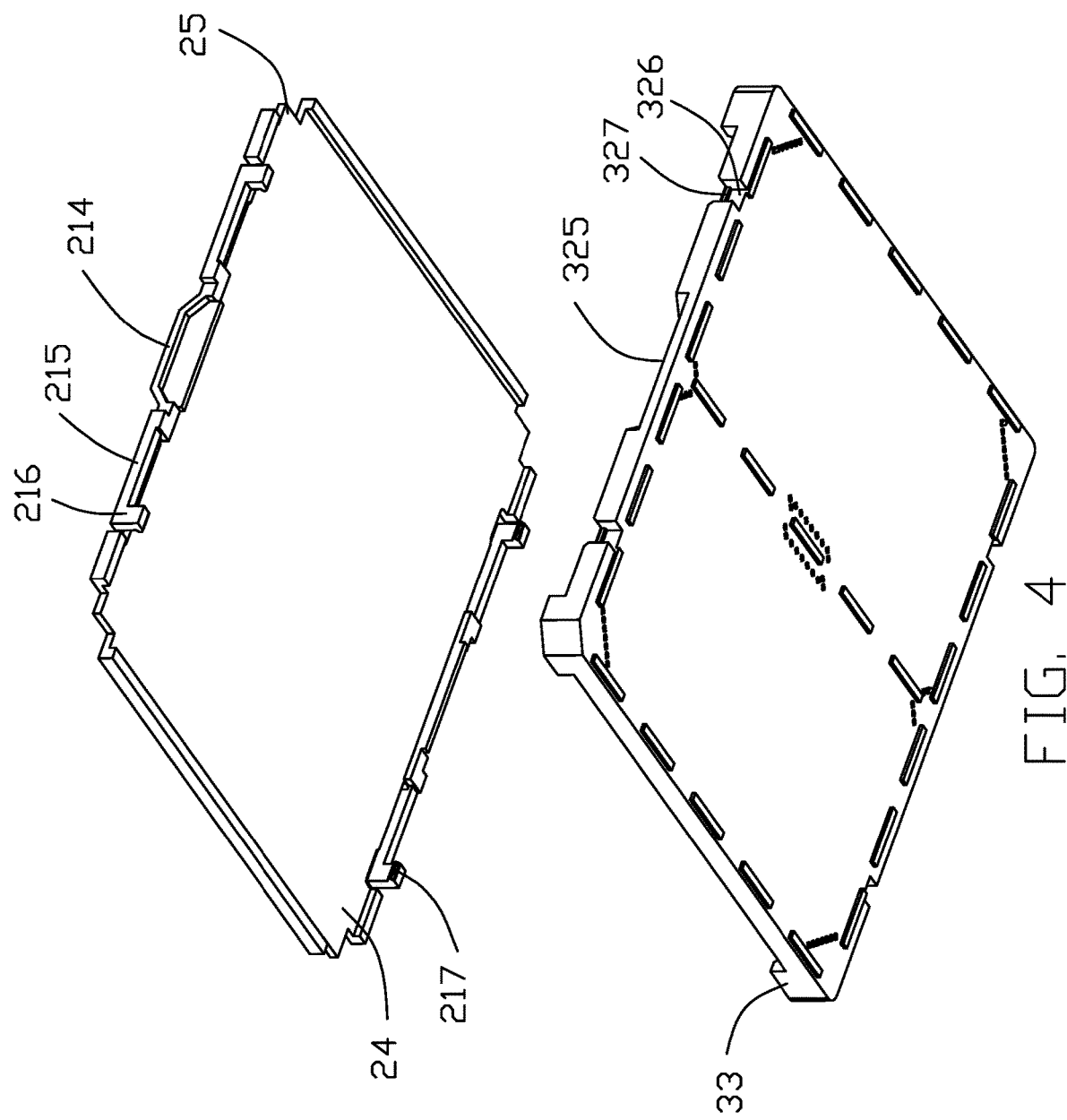
FIG. 4 is another perspective view of the electrical connector assembly of FIG. 3.
Figure 5:
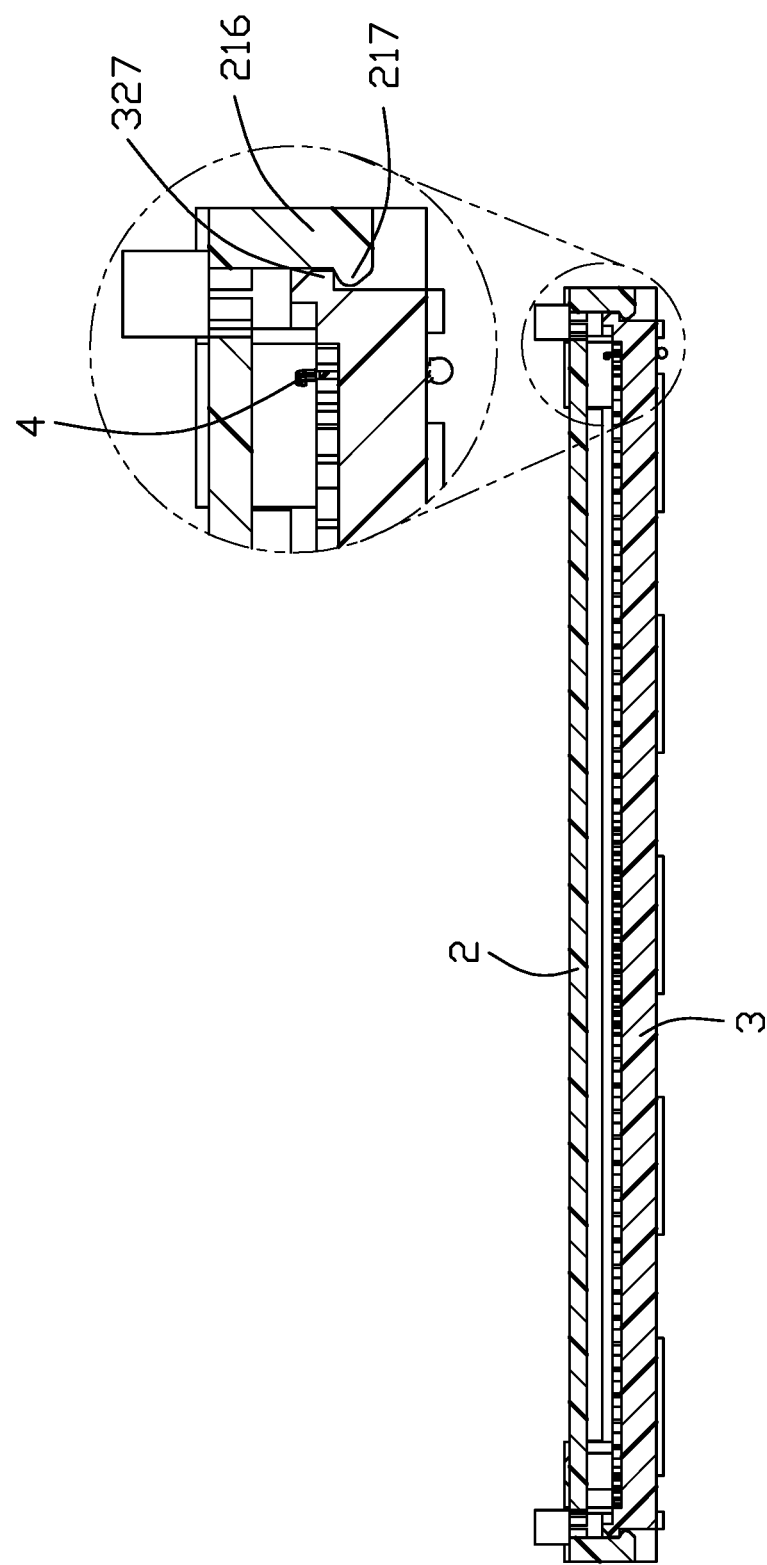
FIG. 5 is a cross-sectional view of the electrical connector assembly of FIG. 1.

Referring to FIGS. 1-5, an electrical connector assembly 100 for mounting to a PCB (not shown) and mating to a CPU (not shown), includes an electrical connector 1 and a pick-up cap 2 which is removably assembled upon the connector. The electrical connector 1 includes an insulative housing 3 and a plurality of contacts 4 disposed in the housing 3. The pick-up cap 2 is adapted to be mounted upon the housing 3.

The housing 3 includes a contact region 31 where the CPU is adapted to be disposed, and a partition region 32 surrounding the contact region 31. The contacts 4 are located in the contact region 31 in matrix. The partition region 32 includes a pair of first side partitions 321 extending in a front-to-back direction, and a pair of second side partitions 322 extending in a lateral direction perpendicular to the front-to-back direction. Each first side partition 321 includes a top face 323 and a first side face 324. The first side partition 321 includes an operation recession 325 and a pair of locking recess 326. The operation recession 326 is inwardly recessed from the first side face 324 and extends through the top face 323. In detail, the operation recession 325 is outwardly diverged in both lateral direction and the vertical direction perpendicular to both the lateral direction and the front-to-back direction. Each locking recess 326 is recessed inwardly from the first side face 324, and extends through both the top face 323 and the bottom face of the first side partition 321. The locking recess 326 forms a downward step 327 for engagement with the hook of the spring arm of the corresponding latch of the pick-up cap 2 illustrated later.

The housing 3 further includes four towers 33 at four corners to form a receiving cavity (not labeled) to receive the CPU wherein the contacts 4 upwardly extend into the receiving cavity for mating with the CPU. At least one of the towers 33 forms an alignment post 331 for assuring orientation of the CPU during mating. To comply with the alignment post 331, the pick up cap 2 also forms the corresponding offset/step structure so as to result in only one orientation of the pick-up cap 2 with regard to the housing 3 of the electrical connector 1. The housing 3 forms a chamfer 332 function as a reference for either assembling the pick-up cap 2 or the CPU upon the housing 3.

The pick-up cap 2 includes a pair of first side walls 21 extending along the front-to-back direction, and a pair of second side walls 22 extending in the lateral direction, and opposite upper surface 23 and lower surface 24 respectively formed on a base plate 20 in the vertical direction. The first side wall 21 is positioned upon the corresponding first side partition 321 and located within the boundary defined by the corresponding first side face 324. The first side wall 21 includes an operation section 211 and a pair of latches 212 both of which are located within the boundary defined by the corresponding first side face 324. The operation section 211 includes cavity 213 inwardly offset from the exterior surface of the first side wall 21, and a raised section 214 located above the cavity 213 and elevated above the upper surface 23. After assembled, the cavity 213 of the pick-up cap 2 is communicatively aligned with the corresponding operation recession 325 in both the lateral direction and the vertical direction.

The latch 212 includes a spring arm 215 extending in the front-to-back direction with a locking head 216 at the free end. The locking head 216 forms a hook 217 at the bottom end. After assembled, the pick-up cap 2 is positioned upon the top face 323, the hook 217 of the locking head 216 is engaged the downward step 327 in the locking recess 326 so as to secure the pick-up cap 2 upon the electrical connector 1. In this situation, in a top view the pair of first side walls 21 remain within the boundary of the pair of first side partitions 321, and the pair of second side walls 22 remain within the boundary of the pair of second side partitions 322 so as to assure that one the PCB the space/region neighboring the electrical connector 1 may be fully used efficiently.

In brief, the latch 212 does not extend beyond the boundary of the housing 3, thus assuring maximization of the usage space on the PCB, wherein the spring arm 215 is located upon the top face 323, and the locking head 216 is received within the locking recess 326. It is noted that the operation recession 325 is to receive the user's finger, and the raised section 214, where the user's finger presses, is not only inwardly offset from the hook 217 in the lateral direction abut also upwardly elevated above the hook 217 so as to facilitate disengagement of the hook 217 from the step 327 when the raised section 214 of the operation section 211 is inwardly pressed by the user's finger.

What is claimed is:

1. An electrical connector assembly comprising:
an electrical connector and a pick-up cap removably attached upon the connector,
the connector including:
an insulative housing having a contact region for confronting a CPU (Central Processing Unit), and a partition region surrounding the contact region;
a plurality of contacts disposed in the contact region;
the partition region having a pair of side partitions, each side partition extending in a front-to-back direction and forming an operation recession and a pair of locking recesses by two sides of the operation recession;
the pick-up cap including:
a base plate defining opposite upper surface and lower surface in a vertical direction perpendicular to the front-to-back direction;
a pair of side walls formed on two lateral sides of the base plate, each side wall extending in the front-to-back direction and aligned with the corresponding side partition in the vertical direction; and
each side wall including an operation section adjacent to the operation recession and a pair of latches with corresponding locking heads received within the corresponding locking recesses, respectively; wherein
in a top view along the vertical direction, each of the side walls is located within a boundary defined by a corresponding side partition thereunder.

2. The electrical connector assembly as claimed in claim 1, wherein the operation section includes a raised section above the upper surface of the base plate and inwardly offset from the locking head of the corresponding latch in a lateral direction perpendicular to both the front-to-back direction and the vertical direction.

3. The electrical connector assembly as claimed in claim 2, wherein the operation section further forms a cavity located under the raised section and communicating with the corresponding operation recession.

4. The electrical connector assembly as claimed in claim 3, wherein the raised section is inwardly offset from the corresponding operation recession in the lateral direction.

5. The electrical connector assembly as claimed in claim 1, wherein a spring arm of each latch is seated upon the corresponding side partition in the vertical direction.

6. The electrical connector assembly as claimed in claim 1, wherein the locking head extends downwardly in the vertical direction with a hook at a bottom end to engage a corresponding downward step formed in the corresponding locking recess.

7. The electrical connector assembly as claimed in claim 1, wherein the operation recession is outwardly divergent in both the vertical direction and the front-to-back direction.

8. The electrical connector assembly as claimed in claim 1, wherein said housing further forms four towers at four corners, at least one of said four towers forms an alignment post, and the base plate of the pick-up cap forms an offset structure to comply with the alignment post so that the pick-up cap is asymmetrical with regard to a centerline thereof and is adapted to be assembled to the housing in only one orientation.

9. An electrical connector assembly comprising:
an electrical connector including:
an insulative housing equipped with a plurality of contacts, said housing including a pair of side partitions opposite to each other in a lateral direction, each partition extending along a front-to-back direction perpendicular to the lateral direction and forming a pair of locking recesses; and
a pick-up cap including:
a rectangular base plate with a pair of side walls each extending along the front-to-back direction and forming an operation section and a pair of latches with respective spring arms extending oppositely in the front-to-back direction; wherein
each of the pair of side walls is seated upon a corresponding side partition in a vertical direction perpendicular to both the lateral direction and the front-to-back direction, without outwardly extending beyond the corresponding side partition in the lateral direction.

10. The electrical connector assembly as claimed in claim 9, wherein each latch further includes a locking head located at a free end of the corresponding spring arm and forming a hook at a bottom thereof.

11. The electrical connector assembly as claimed in claim 10, wherein each partition forms an operation recession adjacent to the corresponding operation section of the pick-up cap, and the pair of locking recesses receive the corresponding locking heads.

12. The electrical connector as claimed in claim 11, wherein the operation section includes a raised section above an upper surface of the base plate in the vertical direction.

13. The electrical connector assembly as claimed in claim 12, wherein the operation section further includes a cavity under the raised section in the vertical direction.

14. The electrical connector assembly as claimed in claim 13, wherein said cavity communicates with the corresponding operation recession in both the vertical direction and the lateral direction.

15. The electrical connector assembly as claimed in claim 14, wherein the raise section is upwardly elevated above the corresponding locking head in the vertical direction, and inwardly offset from the corresponding locking head in the lateral direction.

16. The electrical connector assembly as claimed in claim 11, wherein the operation recession is outwardly divergent in both the vertical direction and the lateral direction.

\* \* \* \* \*